United States Patent
Nirschl

(10) Patent No.: US 8,009,481 B2
(45) Date of Patent: Aug. 30, 2011

(54) SYSTEM AND METHOD FOR BIT-LINE CONTROL

(75) Inventor: Thomas Nirschl, München (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 12/390,959

(22) Filed: Feb. 23, 2009

(65) Prior Publication Data

US 2010/0214851 A1     Aug. 26, 2010

(51) Int. Cl.
*G11C 16/04* (2006.01)

(52) U.S. Cl. .......... 365/185.23; 365/189.11; 365/230.06

(58) Field of Classification Search ............. 365/185.23, 365/189.11, 230.06
See application file for complete search history.

(56) References Cited

U.S. PATENT DOCUMENTS

| 4,317,110 | A  | * | 2/1982  | Hsu ............................ 340/14.63 |
| 6,903,581 | B2 | * | 6/2005  | Clark et al. .................... 327/112 |
| 7,283,406 | B2 | * | 10/2007 | Lu et al. ..................... 365/189.09 |

OTHER PUBLICATIONS

Deml, C., et al., "A 0.13μm 2.125MB 23.5ns Embedded Flash with 2GB/s Read Throughput for Automotive Microcontrollers," IEEE International Solid-State Circuits Conference, Session 26, Non-Volatile Memories, 26.4, 2007, pp. 478-479 and 617.

* cited by examiner

*Primary Examiner* — VanThu Nguyen
(74) *Attorney, Agent, or Firm* — Slater & Matsil, L.L.P.

(57) ABSTRACT

In one embodiment, a bit-line driver has a first driver having a source terminal coupled to a high-voltage supply bus and a drain terminal coupled to the bit-line, and a second driver having a source terminal coupled to a high-voltage return bus and a drain terminal coupled to the bit line. The bit-line driver also has a first pre-driver coupled to a gate terminal of the first driver and a second pre-driver coupled to a gate terminal of the second driver. The first and second drivers use a first type of transistor, and the first and second pre-drivers use a second type of transistor. The first type of transistor is rated at a higher voltage than the second type of transistor.

21 Claims, 7 Drawing Sheets

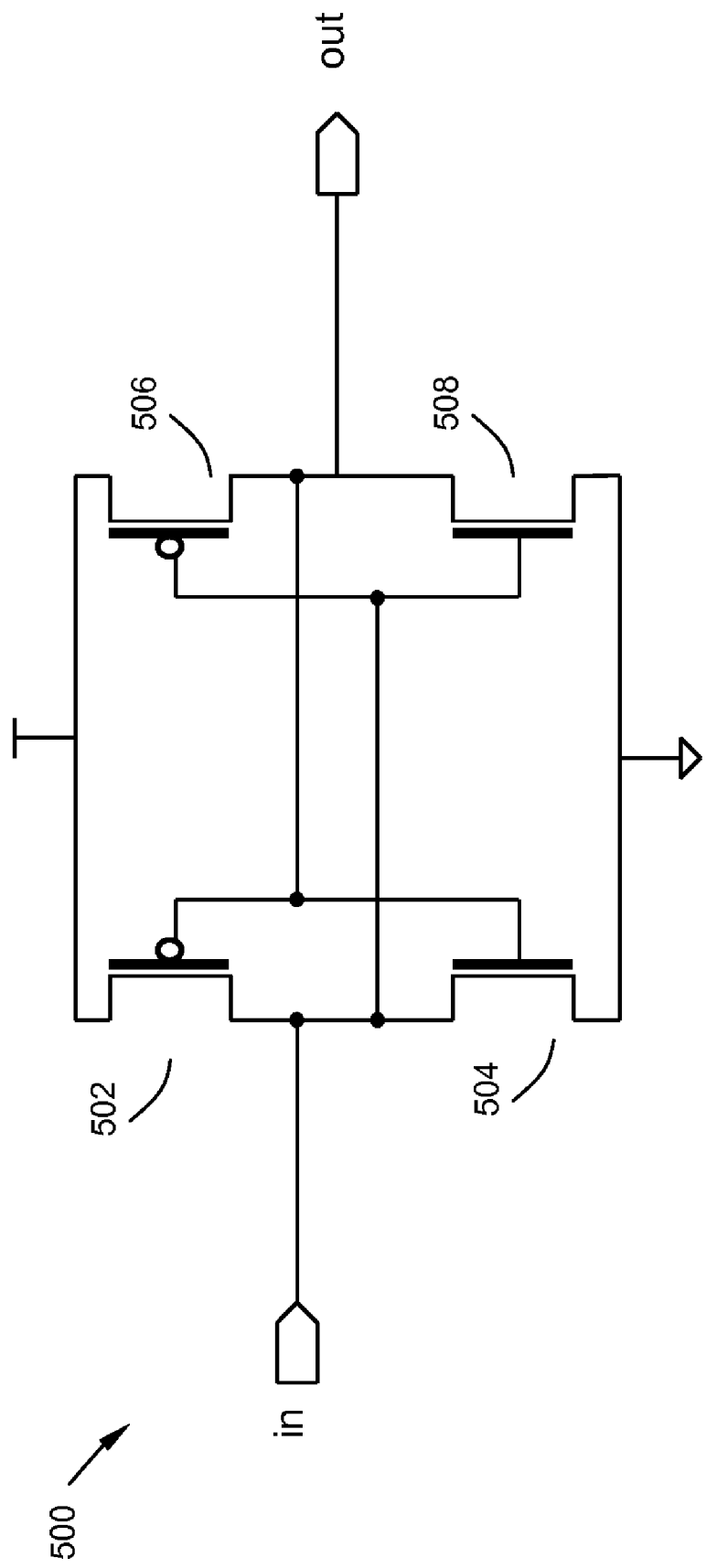

SYSTEM AND METHOD FOR BIT-LINE CONTROL

TECHNICAL FIELD

This invention relates generally to semiconductor circuits, and more particularly to a system and method for a bit-line control.

BACKGROUND

As semiconductor feature sizes get smaller and smaller, the voltage level that these devices can withstand has decreased correspondingly. Thinner gate oxides and shorter channel lengths have reduced common supply voltages from the 5V and 3.3V seen a decade ago to 1.2V and below. The higher device density and faster performance of submicron processes have come at a cost of lower device breakdown voltages. High demand for small portable devices such as MP3 players have also increased the demand for circuits that can operate efficiently on a single battery cell.

Lower power supply voltages have posed a number of circuit design challenges and difficulties. One of these difficulties lies in the design of dense non-volatile memory. Very small feature sizes are required in order to economically fabricate and produce non-volatile memory devices having billions of memory cells on a single integrated circuit. Programming and erasing non-volatile memories such as EEPROM and Flash memory requires applying voltage levels higher than a typical minimum size sub-micron device can withstand. For example, write voltages of about 6V to 7V may be required in a process that only withstands a maximum voltage of about 2V. One solution to this problem has been to fabricate high voltage devices that can withstand the higher programming voltages and use these devices for memory array support circuitry, such as charge-pumps, level shifters and bit line drivers, which must withstand these high voltages.

These high voltage devices come at a cost of thicker oxides and device areas that significantly exceed the device areas of minimum geometry low voltage devices. It is necessary to increase the physical dimensions of these high-voltage devices, as well as provide thicker gate oxides that will not break down or will not fail in the presence of these higher voltages. Incorporating these high voltage devices into high-density non-volatile memories requires devoting a significant amount of silicon area to high voltage support circuitry, thereby limiting the maximum number of non-volatile memory cells that can be fabricated on a given integrated circuit.

In the field of non-volatile memories, what are needed are devices and methods of reducing the area devoted to high-voltage support circuitry.

SUMMARY OF THE INVENTION

In one embodiment, a bit-line driver is disclosed. The driver has a first driver having a source terminal coupled to a high-voltage supply bus and a drain terminal coupled to the bit-line, and a second driver having a source terminal coupled to a high-voltage return bus and a drain terminal coupled to the bit line. The driver also has a first pre-driver coupled to a gate terminal of the first driver and a second pre-driver coupled to a gate terminal of the second driver. The first and second drivers comprise a first type of transistor, and the first and second pre-drivers comprise a second type of transistor. The first type of transistor is rated at a higher voltage than the second type of transistor.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5a illustrates a schematic of an embodiment latch; and

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a bit-line interface for a non-volatile memory. Embodiments of this invention may also be applied to other circuits and systems that require area efficient use of high-voltage support circuitry in high-density circuit applications.

Figure 1:
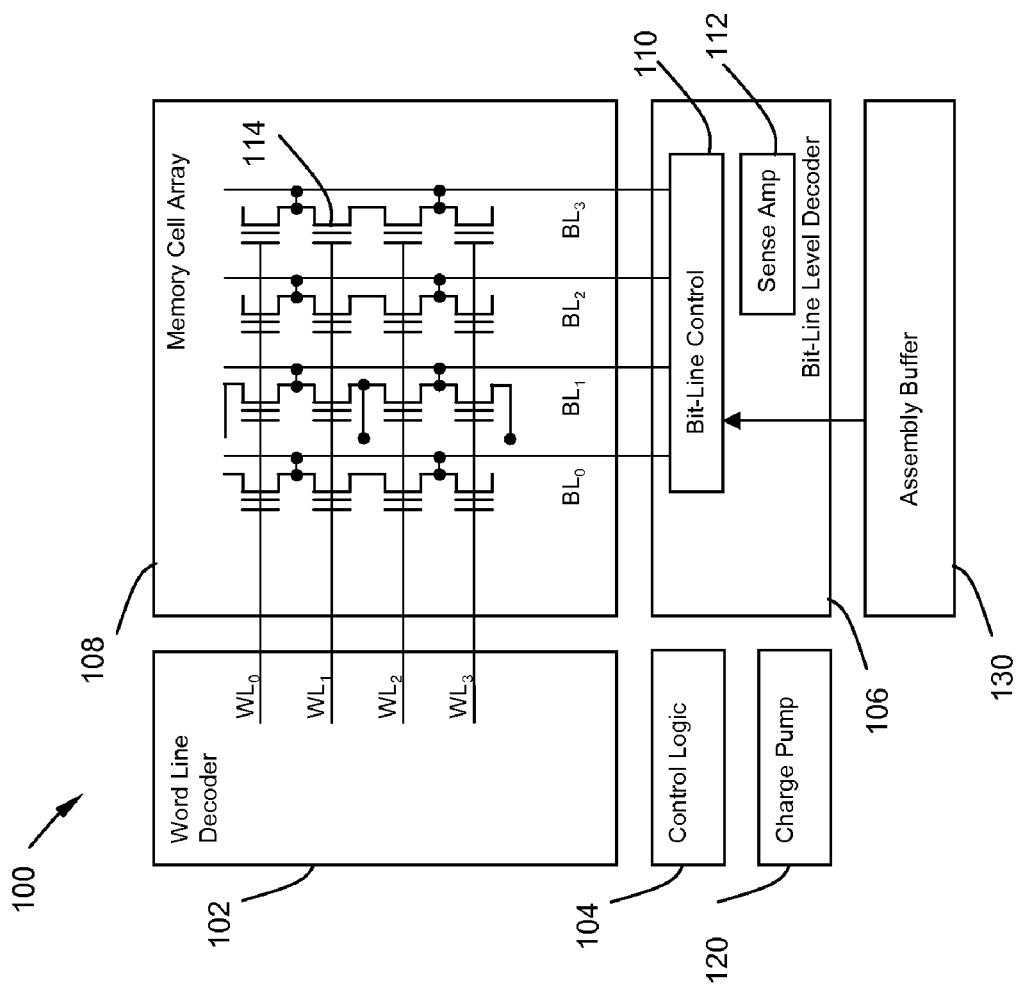
FIG. 1 illustrates an embodiment memory array and associated support circuitry.

A non-volatile memory system 100 according to an embodiment of the present invention is shown in FIG. 1. Non-volatile memory cell array 108 is interfaced to word-line decoder 102 and bit-line decoder 106. Generally, the non-volatile memory cell array 108 is made up of individual non-volatile memory cells 114, are fabricated as floating gate or charge trapping memory cells in preferred embodiments. In alternative embodiments, other cell architectures can be used such as programmable resistance memory cells where a bias larger than the supply voltage is typically used for operation of the memory.

In preferred embodiments of the present invention, memory system 100 is a Flash memory system in which data is written and erased in large blocks. In alternative embodiments, however, other non-volatile architectures can be used such as EEPROM capable of writing data into the memory array 108 byte-by-byte basis. Preferred embodiments utilize Fowler-Nordheim (FN) tunneling techniques for programming memory cells 114. In some embodiments, FN tunneling is used for erasing, as well. FN tunneling requires a very low programming current (for example 1 nA) for each cell at the expense of a longer programming time. For example, FN tunneling typically requires a programming time of between about 1 ms and 20 ms, while faster but higher current programming methods such as source side injection (SSI) may only require between about 10 µs and about 50 µs to program a memory cell. Because memory cells 114 are written in large blocks, however, the average programming time per Flash bit is comparable to, or even less than the average programming time using high current methods. Using FN tunneling is advantageous in embodiments of the present invention because the lower programming current allows for the use of smaller devices in support circuitry surrounding memory cell array 108. In alternative embodiments of the present invention, other non-volatile architectures can be used such as EEPROM in which data may be written on a byte-by-byte basis. Other programming techniques, such as SSI, can be used as well in alternative embodiments.

To facilitate writing large memory blocks, assembly buffer 130 temporarily stores a large block of data to be written. In preferred embodiments, data is written into assembly buffer 130 prior to writing the data into memory cell array 108. In preferred embodiments, the size of this block can be between about 1 and about 2048 bits, however, in alternative embodiments, other sizes can be used.

Bit-line level decoder 106 connects assembly buffer 130 to bit-lines BL3 to BL0. Only four bit-lines are shown for simplicity of illustration, but more bit-lines, for example 2048 bit lines are used in embodiments of the present invention. Bit-lines BL3 to BL0 couples the drains of memory array transistors 114 to sense amplifier 112 during read operations, and to programming voltages generated by charge pump 120 during write and erase operations.

Bit-line level decoder 106 includes bit-line control block 110 containing the circuits that drives the bit-lines. Because programming voltages exceed the maximum operating voltages for low-voltage devices, circuit devices exposed to high voltages are implemented with high-voltage devices. These high-voltage devices have a thicker gate oxide and longer channel widths and lengths than minimum size low-voltage devices to withstand the higher electric fields and to protect devices from breakdown and/or destruction. In embodiments that employ FN tunneling, however, high-voltage devices in the bit-line control block are optimized for smaller size because of the lower currents used, compared to channel hot electron programming techniques such as SSI.

One method of FN tunneling used to program memory cells 114 requires the drain potential of memory cell 114 to be raised to a high programming voltage. This high programming voltage is typically between about 4V and about 6V according to embodiments of the present invention. Voltages outside of this range that are sufficient to program memory cell array 108 can also be used, given a particular application and process. In embodiments of the present invention, bit-line level control 110 is used to interface either a high programming voltage to bit-lines BL3 to BL0, or a lower reference voltage, such as ground or a negative voltage, depending on the desired programming state.

Bit-line control block 110 further includes circuits to latch the contents of assembly buffer 130 prior to writing of the memory cell array 108. In some embodiments of the present invention, the interface to the memory is narrow, for example, 16 bits wide. In order to accommodate the programming of a complete page, for example 2048 bits, the data is stored in an assembly buffer. In conventional embodiments, bit-line control block 110 is physically large because of the many high-voltage devices required to latch input data and drive the bit-lines. In embodiments of the present invention, devices that latch input data and drive the bit-lines are more optimally partitioned between high-voltage devices and low voltage devices such that total device area is reduced.

Word line decoder 102 controls word lines WL3 to W0 coupled to the gates of a row of memory cells 114 in embodiments of the present invention. Word line decoder 102 decodes an input address and selects the proper word line to be asserted during a memory operation. In the illustration in FIG. 1, only four word lines are shown, however, in preferred embodiments of the present invention, more word lines, for example between about 128 and about 512, can be interfaced to the word line decoder.

Non-volatile memory system 100 also has control logic that generates control signals for the operation of the memory, and charge pump 120 that generates the high voltage required to write and erase the memory in embodiments of the present invention.

Figure 2:
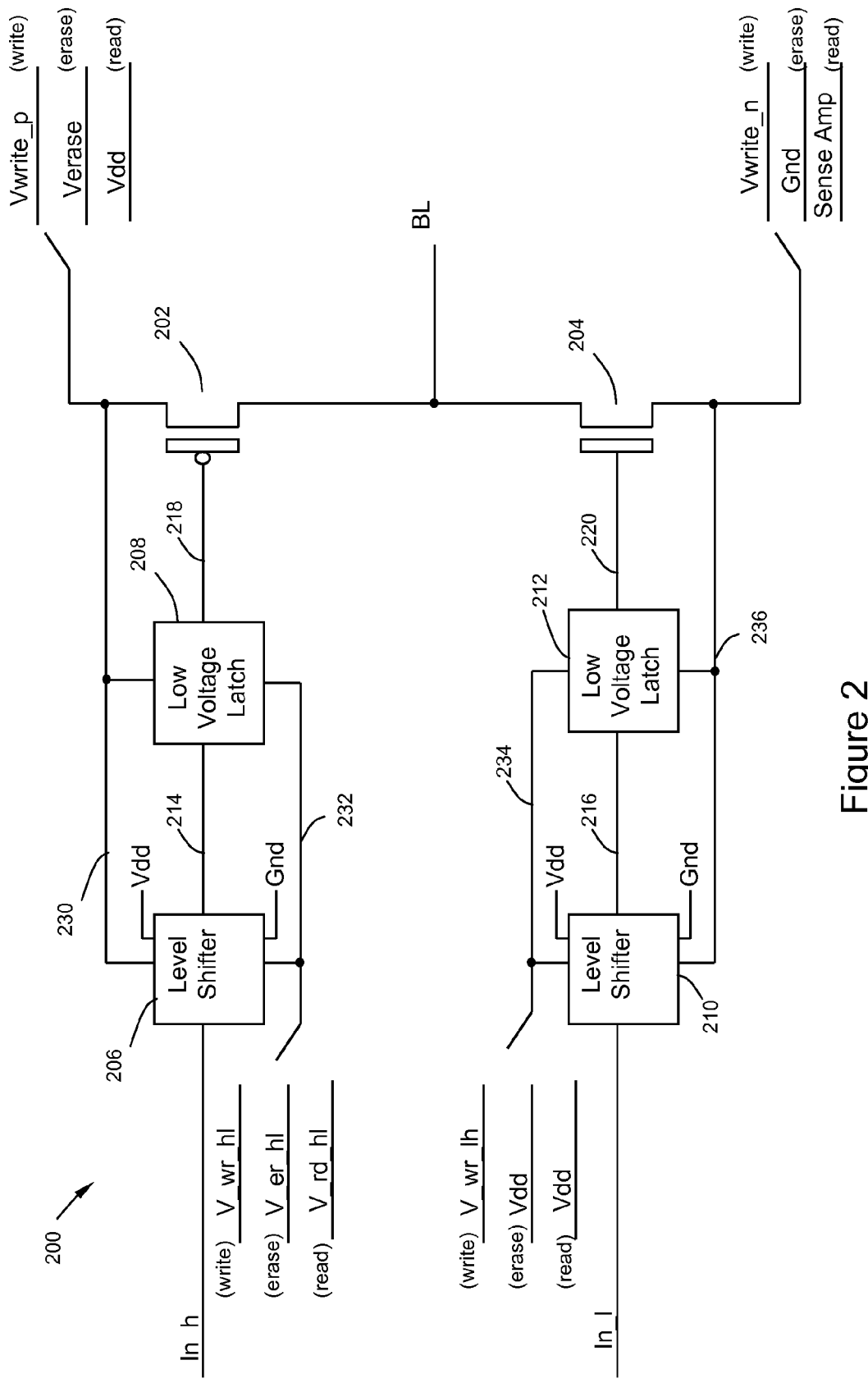
FIG. 2 illustrates a schematic of an embodiment bit-line control circuit.

Turning to FIG. 2, bit-line control block 200 is shown according to an embodiment of the present invention. Bit-line BL is driven by PMOS device 202 and NMOS device 204, which are high-voltage or medium-voltage devices able to withstand higher voltages than the standard low-voltage logic of the embodiment process.

In preferred embodiments of the present invention, medium-voltage devices are preferably used for PMOS device 202 and NMOS device 204. Such medium-voltage devices can withstand gate voltages up to about 16V, and withstand drain-source voltages up to about 7V. Alternatively, high-voltage devices can be used. These high-voltage devices can withstand gate voltages up to about 16V, and withstand drain-source voltages up to about 17V in embodiments of the present invention. Low-voltage devices, on the other hand, can only withstand drain-source voltages up to about 1.5V before breaking down.

The gates of PMOS device 202 and NMOS device 204 are driven by low voltage latches 208 and 212 respectively on signal lines 218 and 220. Low voltages-latches 208 and 212 are driven by level shifters 206 and 210. The source of PMOS device 202 shares supply rail 230 with supply nodes of low-voltage latch 208, level shifter 206, and the source of NMOS device 204.

In preferred embodiments of the present invention, low voltage latches 208 and 212 are exposed to low supply voltages typical of low-voltage standard logic in an embodiment CMOS process, for example, 1.5V. Bit-line BL, on the other hand, drives voltages exceeding 1.5V. For example, in write mode, bit-line BL is driven from about −3V to about 3V for a peak-to-peak voltage of 6V. In conventional embodiments, latches 208 and 212 are typically implemented as high voltage devices. In embodiments of the present invention, high-voltage or medium-voltage 202 and 204 are driven by biasing the supply rails of low-voltage latches 208 and 212 at voltages sufficiently above and below the thresholds (Vt) of PMOS and NMOS devices 202 and 204.

Because the source of PMOS device 202 shares supply rail 230 with low voltage latch 208, the gate-source voltage of PMOS device 202 is zero and the device is shut off when the output of low voltage latch 208 is driven at its highest potential. If lower supply rail 232 of low voltage latch 208 is biased at a voltage sufficient to turn-on PMOS device 202, for example, 1.5V below the supply rail 230, PMOS device 202 pulls the voltage of bit-line BL to the potential of supply rail 230. In preferred embodiments, when the memory is being written voltage Vwrite_p, nominally about 3V, is coupled to supply node 230 and voltage V_wr_hl, nominally about 1.5V, is coupled to supply rail 232. Level shifter 206 shifts logic input In_h, nominally having logic levels of about 0V (GND) for logic "Low" and about 1.5V (VDD) for logic "High," to output 214 nominally having logic levels of about 1.5V (V_wr_hl) for logic "Low" and about 3V (the value of Vwrite_p) for logic "High" during write operations.

Likewise, because the source of NMOS device 204 shares supply rail 236 with low voltage latch 212, the gate-source voltage of NMOS device 204 is zero and the device is shut off when the output of low voltage latch 212 is driven to its lowest potential. If upper supply rail 234 of low voltage latch 212 is biased at a voltage sufficient to turn-on NMOS device 204, for example, 1.5V above supply rail 236, NMOS 204 device will pull the voltage bit-line BL to the potential of supply rail 236. In preferred embodiments, when the memory is being written, voltage Vwrite_n, nominally about −3V, is coupled to supply node 236 and voltage V_wr_lh, nominally about −1.5V, is coupled to supply rail 234. Level shifter 210 shifts logic input In_l, nominally having logic levels of about 0V (GND) for logic "Low" and about 1.5V (VDD) for logic "High," to output 216 nominally having logic levels of about −3V (Vwrite_n) for logic "Low" and about −1.5V (the value of Vwrite_n) for logic "High" during write operations.

During erase operations, supply node 230 is switched to Verase, nominally about 5V, supply node 236 is switched to Gnd, nominally at about 0V, supply 232 is switched to V_er_hl, nominally about 3.5V, and supply 236 is switched to Vdd, which is nominally about 1.5V. The voltages at these nodes are switched because, for this embodiment, FN tunneling is used for erasing while SSI is used for writing. It can be seen that in erase mode, the voltage at bit-line BL can range from about 0V (Gnd) to about 5V (Verase), the voltage at node 218, the output of low-voltage latch 208, can range from about 3.5V (V_er_hl) to about 5V (Verase), and the voltage at node 220, the output of low-voltage latch 236, can range from about 0V (Gnd) to about 1.5V (Vdd). In alternative embodiments of the present invention, other voltages can be used depending on the specifications, process and the physical programming mechanism.

During read operations, supply node 230 is switched to VDD, nominally about 1.5V, supply node 236 is switched to Gnd, nominally at about 0V, supply 232 is switched to V_rd_hl, nominally about 3.5V, and supply 236 is switched to Vdd, which is nominally about 1.5V. It can be seen that in read mode, the voltage at bit-line BL can range from about 0V (Gnd) to about 1.5V (VDD), the voltage at node 218, the output of low-voltage latch 208, can range from about Gnd (V_rd_hl) to VDD, and the voltage at node 220, the output of low-voltage latch 236, can range from about 0V (Gnd) to about 1.5V (Vdd). During read operations, bit-line BL is pre-charged by a sense amplifier connected to the bit-line by device 204. Once the bit-line is charged the bit-line is discharged though memory array 108 depending on the state of the particular memory cells 114 attached to bit-line BL. For example, if memory cell 114 is programmed a current conducting state when its corresponding word-line is asserted, then bit-line BL will be discharged. If, on the other hand, memory cell 114 is programmed in a state that prevents current conduction when its corresponding word-line is asserted, then bit-line BL will not be discharged. Once bit-line BL has had sufficient time to discharge, sense amp 112 measures a voltage or current on bit-line BL and outputs the programmed memory state.

In alternative embodiments of the present invention, other reading, writing and erasing techniques known in the art may also be used. It should also be understood that supply voltages different from the voltages described hereinabove can be used depending on the application and process being used in alternative embodiments of the present invention. For example, Vwrite_p may be higher or lower than +5V.

In embodiments utilizing FN tunneling techniques, PMOS 202 and NMOS 204 can be made considerably smaller than a comparable transistor in embodiments utilizing higher current SSI techniques. Furthermore, power required to charge and discharge the gate-source capacitance of driver devices 202 and 204 is saved by driving the gates of PMOS 202 and NMOS 204 with the reduced voltage swing output of low-voltage latches 208 and 212. Power consumption, can be further reduced by optimizing the voltages that drive the gates of driver devices 202 and 204.

Figure 3A:
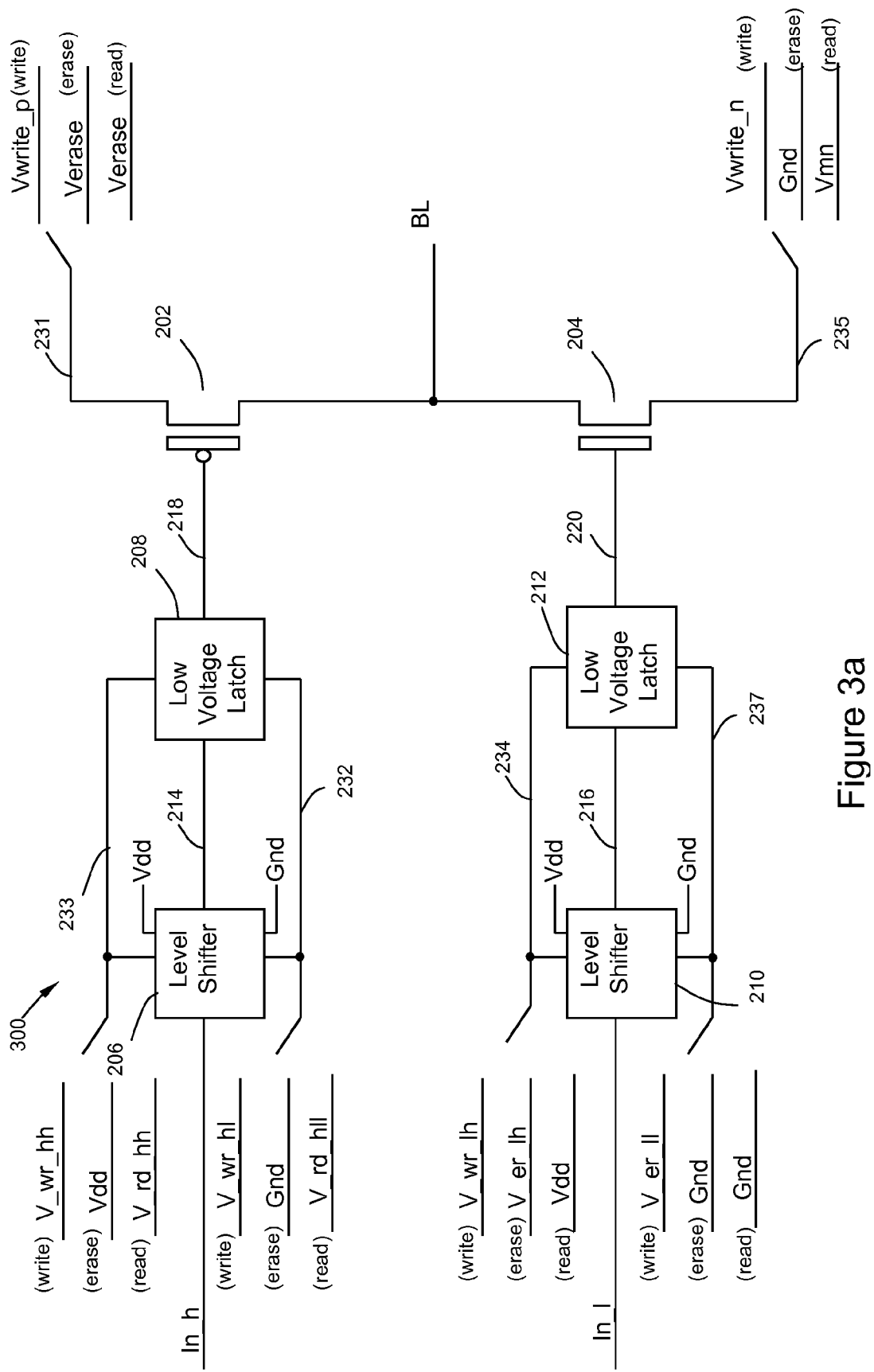
FIGS. 3a-b illustrate schematics of an alternative embodiment bit-line control circuit.

Turning to FIG. 3a, an alternative embodiment of the present invention is shown. Bit-line control 300 is similar to the circuit shown in FIG. 2, except that high-voltage or medium voltage devices 202 and 204 have separate power supplies from low-voltage latches 208 and 212. For example, during write mode, the source of PMOS 202 at high-voltage supply node 231 is coupled to Vwrite_p. Low-voltage latch 208, however, is coupled to supply node 233 that is coupled to V_wr_hh in preferred embodiments of the present invention. Likewise, the source of NMOS 204 at high-voltage supply node 235 is coupled to Vwrite_n and low-voltage latch 212 is coupled to supply node 237 that is coupled to V_wr_ll. By decoupling the supplies of low-voltage latches 208 and 212 with high-voltage or medium voltage drivers 202 and 204, the driving voltages at the gates of devices 202 and 204 can be driven with a lower voltage swing than the embodiment of FIG. 2.

Good performance can be maintained and power consumption reduced if the gates of devices 202 and 204 are driven no more than is necessary to maintain both driving performance when the devices are on and sufficient leakage performance when devices 202 and 204 are off. Devices 202 and 204 should be driven sufficiently below their threshold to prevent leakage and sub-threshold conduction. In preferred embodiments of the present invention, the gates of devices 202 and 204 are driven to at level at which each one of these devices conduct no more than a few pA of current. On the other hand, sufficient drive performance can be obtained if the gates of devices 202 and 204 are driven at least about 200 mV above the threshold. In preferred embodiments of the present invention, supplies 233 and 232 of low-voltage latch 208 and supplies 234 and 237 of low-voltage latch 212 are optimized to provide just enough voltage drive to turn devices 202 and 204 on and off.

Figure 3B:
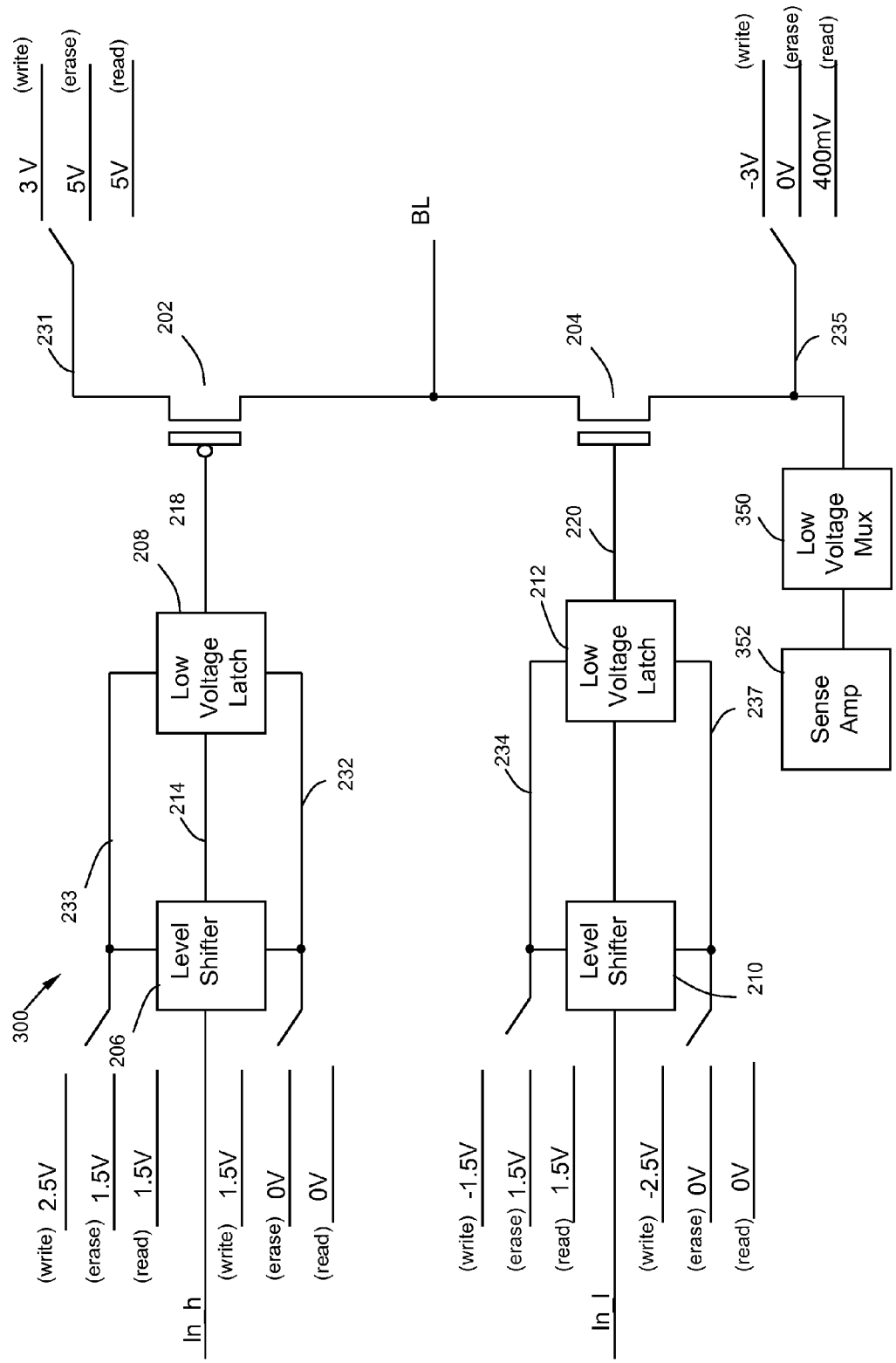

Turning to FIG. 3b, an embodiment of the present invention is shown where the gates of devices 202 and 204 are driven with a 1V peak-to-peak voltage swing in write mode. Devices 202 and 204 are biased with a Vgs of about 0.5 volts when shut off and a Vgs of about 1.5V when turned-on. For example, in write mode, the source of device 202 is biased at about 3V and its gate is biased at about 2.5V when off and at 1.5V when on. Likewise, the source of device 204 is biased at −3V and its gate is biased at −2.5V off and at −1.5V when on. Less power, therefore, is dissipated charging and discharging the gates of devices 202 and 204 in this embodiment because of the lower voltage swing.

In the erase mode, however, an entire row of memory cells must be erased simultaneously while bit-line BL is held at Verase, which is nominally about 5V. In some embodiments of the present invention, device 202 is always on and device 204 is always off during erase mode. Supplies 233 and 232 of low-voltage latch 208 are set to about 1.5V and about 0V respectively, and supplies 231 and 235 of devices 202 and 204 are set to about 5V and to about 0V respectively during erase mode. When In_h is active, the gate of PMOS device 202 is set to about 0V, yielding a total Vgs of about 5V. The increased Vgs ensures that sufficient current is supplied to the bit-line during an erase operation. Alternatively, an erase cycle can be performed with the gate of PMOS device set to 1.5V. Here, the Vgs of PMOS device 202 is set to be about 2.5V, which may still be sufficient to perform the erase in some embodiments. Supplies 234 and 237 of low-voltage latch 212 driving the gate of NMOS device 204 is set to about 1.5V and about 0V respectively. NMOS device 204 is typically not active during erase mode because a high voltage is supplied to bit-line BL during ease operation. It is, therefore, not necessary to optimize the drive performance of NMOS device 204 as is done with PMOS device 202.

Read mode proceeds as described hereinabove. To ensure high speed read operation, the medium voltage devices such as PMOS device 202 and NMOS device 204 are not switched but are biased to be conducting. A subsequent low-voltage mux 350 and sense amp 352 are used to pre-charge and evaluate memory cell contents. Low voltage mux 350 and sense amp 352 are implemented according to techniques known in the art. In alternative embodiments of the present invention, other read schemes can be used.

Again, it should be appreciated that in alternative embodiments of the present invention, voltage levels assigned to supplies 231, 232, 233, 234, 235 and 237 as described hereinabove can vary according to the particular process and application used.

Supply voltage generation can be achieved according to conventional techniques known in the art. For example, the supplies can be generated using on-chip voltage references and/or off-chip supply pins. The high-voltages used for programming, such as the −3V, 3V and 5V supplies are preferably generated using on-chip charge pumps. Supply voltages can be regulated according to a fixed voltage reference, such as a bandgap reference, or according to process dependent voltages. For example, process dependent voltages that track MOS thresholds can be used to supply the low-voltage latches in order to optimize turn-on and turn-off voltages and minimize driving voltage swings.

Figure 4:
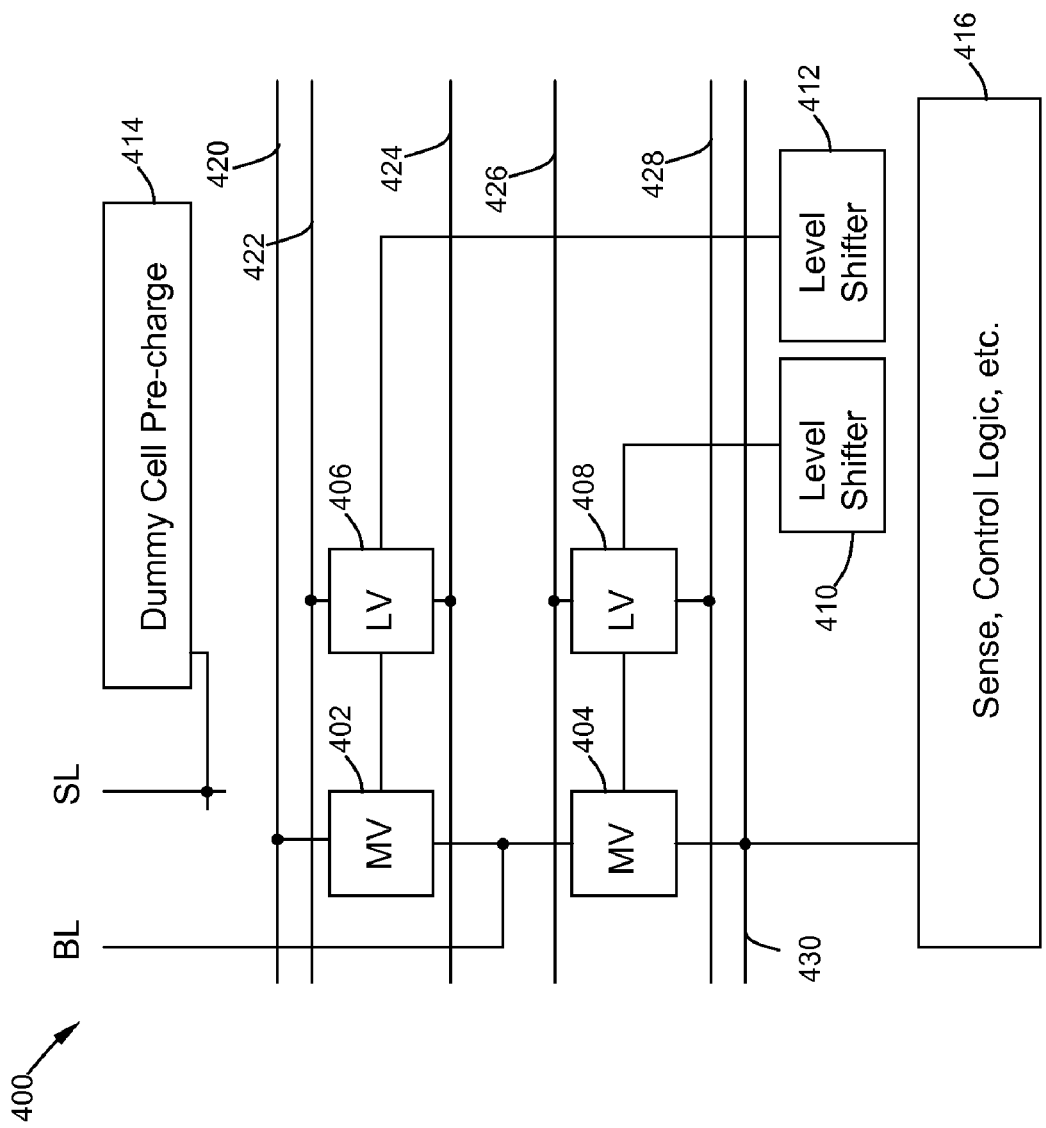
FIG. 4 illustrates a layout arrangement for an embodiment bit-line control circuit.

Turning to FIG. 4, an embodiment layout arrangement 400 is shown, which illustrates the physical placement of circuits and supply busses in the bit-line control. Blocks 406 and 408 represent the low-voltage latches, blocks 402 and 404 represent the NMOS and PMOS high-voltage or medium voltage devices, and blocks 410 and 412 represent the level shifters. Supply line 420 is coupled to the high supply of the PMOS driver 402 and supply line 430 represents the low supply of the NMOS driver 404. Supplies 422 and 424 supply the high and low supply of low voltage level shifter 406 respectively and supplies 426 and 428 supply the high and low supply of low voltage level shifter 408 respectively. Block 416 represents the sense amps and control logic. Precharge of the source line is performed by dummy cell precharge block 414, which has a dummy cell row or rows of dummy cells used to terminate the memory array. Dummy cell precharge block 414 also reduced the effect of device mismatch due to lithography effects. In preferred embodiments of the present invention, multiple instances of bit-line control 400 are instantiated along supply lines 420, 422, 424, 426, 428 and 430 and run alongside memory cell array 108. In alternative embodiments of the present invention, other layout and cell arrangements can be implemented.

Turning to FIG. 5a, low-voltage latch 500 is shown according to an embodiment of the present invention. Latch 500 is made up of PMOS devices 502 and 506 and NMOS devices 504 and 508 coupled in a cross-coupled inverter configuration. Input from node is presented to latch 500. For example, if node in is forced high, then node out will be driven low by NMOS device 508. If node in is forced low, on the other hand, node out will be forced high by PMOS device 506. If the input is removed or placed in a high impedance state, the state of latch 500 will be maintained. In alternative embodiments of the present invention, PMOS device 502 may be omitted to form an inverter with a hold. An inverter with a hold in this case will hold a high output state, but will not hold a low output state. In further embodiments of the present invention, other latching structures known in the art may be used.

Figure 5B:
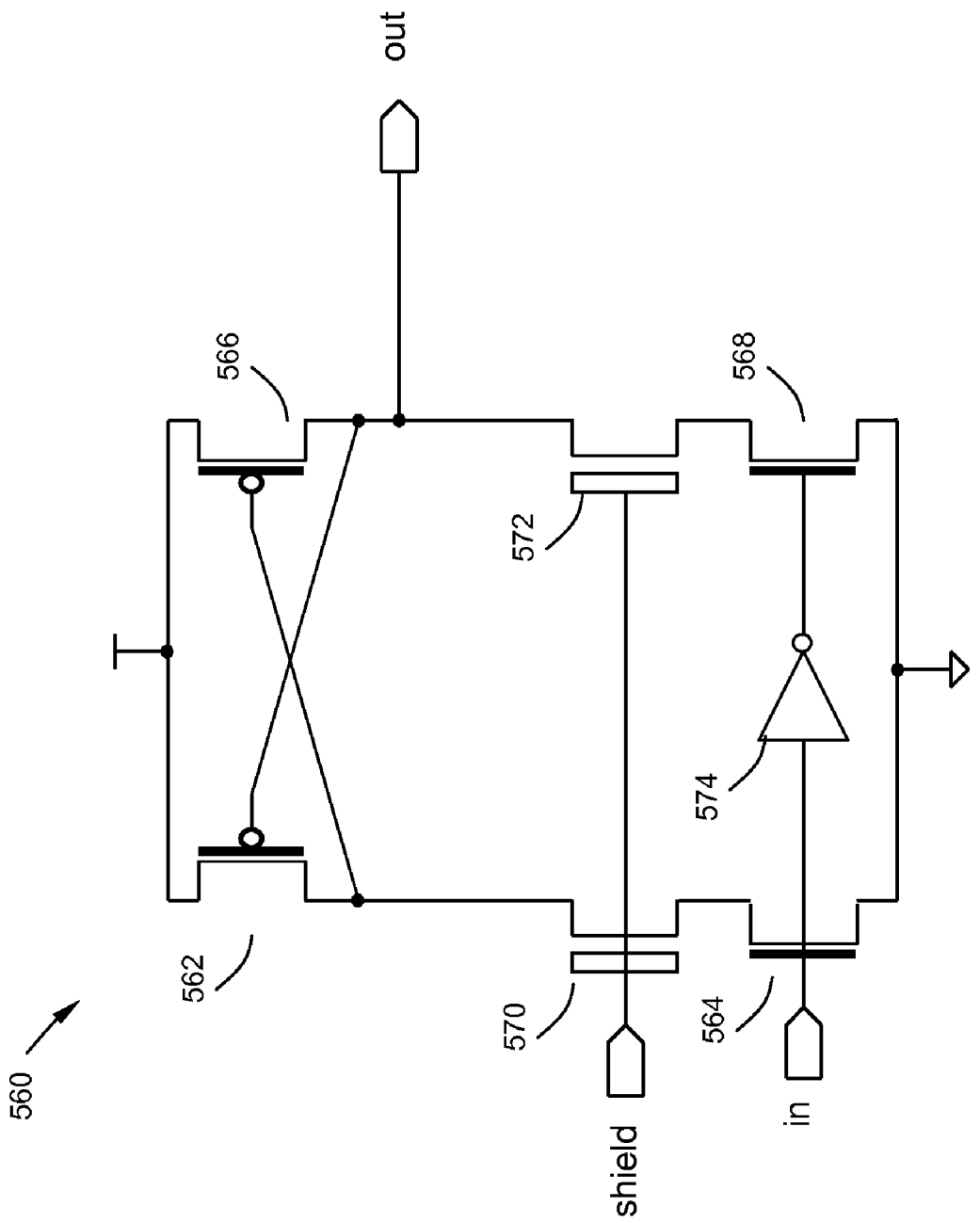
FIG. 5b illustrates a schematic of an embodiment level shifter.

FIG. 5b shows level shifter 560 composed of cross-coupled PMOS transistors 562 and 566, low voltage NMOS input transistors 564 and 568, inverter 574, and medium or high voltage NMOS shield transistors 570 and 572. Input at node in is introduced at the gate of NMOS 564, while the logical inverse of the signal at node in is introduced at the gate of 568. If the input at node in is high, the drain of PMOS transistor 652 is pulled down, which turns on the gate of PMOS transistor 566, thereby pulling node out toward the supply voltage. The gates of shield transistors 570 and 572, are biased at a voltage sufficient to prevent the full power supply voltage from being applied to transistors 562, 566 564 and 568, thereby preventing device breakdown and/or destruction. In alternative embodiments, other level shifter topologies can be used.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A bit-line driver comprising:
    a first driver comprising
        a source terminal coupled to a high-voltage supply bus, and
        a drain terminal coupled to the bit-line;
    a second driver comprising
        a source terminal coupled to a high-voltage return bus, and
        a drain terminal coupled to the bit line;
    a first pre-driver directly connected to a gate terminal of the first driver; and
    a second pre-driver directly connected to a gate terminal of the second driver, wherein the first and second drivers comprise a first type of transistor, and the first and second pre-drivers comprise a second type of transistor, wherein the first type of transistor is rated at a higher voltage than the second type of transistor, and wherein the first and second pre-drivers each comprises a storage element.

2. The bit-line driver of claim 1, wherein the storage element comprises a latch.

3. The bit-line driver of claim 1, wherein:
the first pre-driver comprises a supply node coupled to a first low-voltage supply bus and a ground node coupled to a first low-voltage return bus; and
the second pre-driver comprises a supply node coupled to a second low-voltage supply bus and a ground node coupled to a second low-voltage return bus.

4. The bit-line driver of claim 1, wherein:
the first pre-driver comprises a supply node coupled to the high-voltage supply bus and a ground node coupled to a first low-voltage return bus; and
the second pre-driver comprises a supply node coupled to a first low-voltage supply bus and a ground node coupled to the high-voltage return bus.

5. The bit-line driver of claim 4, further comprising:
a first level shifter coupled to the first pre-driver; and
a second level shifter coupled to the second pre-driver.

6. The bit-line driver of claim 1, wherein the bit-line is coupled to a memory array.

7. The bit line driver of claim 1, wherein the second type of transistor comprises a smaller area than the first type of transistor.

8. A memory comprising:
a memory array comprising a plurality of storage cells;
a bit-line coupled to at least one storage cell; and
a bit-line driver comprising
a first driving transistor coupled to the bit-line,
a first low-voltage pre-driver directly connected to a control terminal of the first driving transistor, the first low-voltage pre-driver comprising at least one low-voltage transistor, the at least one low-voltage transistor rated to operate at lower voltages than the driving transistor,
a second driving transistor coupled to the bit line,
a second low-voltage pre-driver coupled to a control terminal of the second driving transistor, the second low-voltage pre-driver comprising at least one low-voltage transistor, wherein the first and second pre-drivers comprise latches.

9. The memory of claim 8, wherein the first driving transistor is coupled to a high-voltage power bus and the first low-voltage pre-driver is coupled to a low-voltage power bus.

10. The memory of claim 8, wherein:
the first low-voltage pre-driver is configured to drive a shut-down voltage, the shut-down voltage comprising a first set voltage below a turn-on threshold of the first driving transistor in response to a first input voltage; and
the first low-voltage pre-driver is further configured to drive a turn-on voltage, the turn-on voltage comprising a second set voltage above the turn-on threshold of the first driving transistor in response to a second input voltage.

11. The memory of claim 10, wherein the first set voltage and the second set voltage is optimized to reduce power consumption.

12. The memory of claim 8, wherein the latches comprise elements of an assembly latch.

13. The memory of claim 8, wherein the bit-line driver is configured erase the memory array using Fowler-Nordheim tunneling.

14. The memory of claim 8, wherein the bit-line comprises a plurality of bit-lines.

15. A semiconductor circuit comprising:
a first level shifter coupled to a first input;
a first pre-driver comprising
an input node coupled to an output of the first level shifter, and
a supply node coupled to a first supply bus;
a PMOS transistor comprising
a gate coupled to an output of the first pre-driver,
a drain coupled to a bit-line,
and a source coupled to a second supply bus;
a second level shifter coupled to a second input;
a second pre-driver comprising
an input node coupled to an output of the second level shifter, and
a supply node coupled to a third supply bus; and
an NMOS transistor comprising
a gate coupled to an output of the second pre-driver,
a drain coupled to a bit-line, and
a source coupled to a fourth supply bus, wherein the PMOS and NMOS transistors are rated at a higher voltage than the first and second pre-drivers.

16. The semiconductor circuit of claim 15, further comprising supply selection circuits coupled to the first, second, third and fourth supply buses, wherein
the supply selection circuits are configured to apply a plurality of supply voltages to the first, second, third and fourth supply buses, and
the supply selection circuits are configured to apply the plurality of supply voltages according to a memory mode.

17. The semiconductor circuit of claim 15, wherein the first and second pre-drivers each comprise a storage element.

18. The semiconductor circuit of claim 17, wherein the storage element comprises a latch.

19. A bit-line driver comprising:
a first driver comprising
a source terminal coupled to a high-voltage supply bus, and
a drain terminal coupled to the bit-line;
a second driver comprising
a source terminal coupled to a high-voltage return bus, and
a drain terminal coupled to the bit line;
a first pre-driver coupled to a gate terminal of the first driver; and
a second pre-driver coupled to a gate terminal of the second driver, wherein the first and second drivers comprise a first type of transistor, and the first and second pre-drivers comprise a second type of transistor, wherein the first type of transistor is rated at a higher voltage than the second type of transistor, wherein
the first pre-driver comprises a supply node coupled to a first low-voltage supply bus and a ground node coupled to a first low-voltage return bus, and
the second pre-driver comprises a supply node coupled to a second low-voltage supply bus and a ground node coupled to a second low-voltage return bus.

20. The bit-line driver of claim 19, wherein
the first low-voltage supply bus is coupled to the high-voltage supply bus; and
the second low-voltage return bus is coupled to the high-voltage return bus.

21. A memory comprising:
a memory array comprising a plurality of storage cells;
a bit-line coupled to at least one storage cell; and a bit-line driver comprising
- a first driving transistor coupled to the bit-line,
- a first low-voltage pre-driver coupled to a control terminal of the first driving transistor, the first low-voltage pre-driver comprising at least one low-voltage transistor, wherein,
  - the first low-voltage pre-driver is configured to drive a shut-down voltage, the shut-down voltage comprising a first set voltage below a turn-on threshold of the first driving transistor in response to a first input voltage, and
  - the first low-voltage pre-driver is further configured to drive a turn-on voltage, the turn-on voltage comprising a second set voltage above the turn-on threshold of the first driving transistor in response to a second input voltage.

* * * * *